United States Patent
Mitra

(10) Patent No.: US 6,208,005 B1
(45) Date of Patent: Mar. 27, 2001

(54) MERCURY-BASED QUATERNARY ALLOYS OF INFRARED SENSITIVE MATERIALS

(75) Inventor: Pradip Mitra, Grand Prairie, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/259,877

(22) Filed: Mar. 1, 1999

Related U.S. Application Data

(62) Division of application No. 08/882,881, filed on Jun. 26, 1997.

(51) Int. Cl.$^7$ .................................................. H01L 31/00
(52) U.S. Cl. ........................... 257/442; 257/78; 257/190; 257/201; 257/614; 438/95; 438/518
(58) Field of Search .................. 438/95, 518, 930; 257/442, 188, 78, 201, 190, 614, 467; 117/104, 105

(56) References Cited

U.S. PATENT DOCUMENTS

| | | | |
|---|---|---|---|
| 4,213,797 | 7/1980 | Sher | 136/89 SP |
| 4,343,881 | 8/1982 | Sher et al. | 430/57 |
| 4,376,659 | 3/1983 | Castro | 148/1.5 |

(List continued on next page.)

FOREIGN PATENT DOCUMENTS

| | | |
|---|---|---|
| 59-195881 | 11/1984 | (JP) . |
| 3-237762 | 10/1991 | (JP) . |

OTHER PUBLICATIONS

"Metalorganic Vapor Phase Epitaxy Of Mercury Cadmium Telluride", J.B. Mullin et al, Progress in Crystal *Growth and Characterization*, vol. 29, (1994) pp. 217–252.

"The Relationship Between Lattice Matching and Crosshatch in Liquid Phase Epitaxy HgCdTe on CdZnTe Substrates", S. P. Tobin et al, *Journal of Electronic Materials*, vol. 24, No. 9, (1995) pp. 1189–1199.

"Donor Doping In Metalorganic Chemical Vapor Deposition of HgCdTe Using Ethyl Iodide", P. Mitra et al, *Appl. Phys. Lett.* 65 (2), (Jul. 11, 1994) pp. 195–197.

"Metalorganic Chemical Vapor Deposition of HgCdTep/n Junctions Using Arsenic And Iodine Doping", P. Mitra et al, *Journal of Electronic Materials*, vol. 24, No. 9 (1995) pp. 1077–1085.

(List continued on next page.)

*Primary Examiner*—Charles Bowers
*Assistant Examiner*—Hsien-Ming Lee
(74) *Attorney, Agent, or Firm*—Sidley & Austin; Stephen S. Sadacca

(57) ABSTRACT

A variable bandgap infrared absorbing material, $Hg_{1-x}Cd_x Te$, is manufactured by use of the process termed MOCVD-IMP (Metalorganic Chemical Vapor Deposition-Interdiffused Multilayer Process). A substantial reduction in the dislocation defect density can be achieved through this method by use of CdZnTe layers which have a zinc mole fraction selected to produce a lattice constant which is substantially similar to the lattice constant of HgTe. After the multilayer pairs of HgTe and $Cd_{0.944}Zn_{0.056}Te$ are produced by epitaxial growth, the structure is annealed to interdiffuse the alternating layers to produce a homogeneous alloy of mercury cadmium zinc telluride. The mole fraction x in $Hg_{1-x}(Cd_{0.944}Zn_{0.056})_x Te$ can be varied to produce a structure responsive to multiple wavelength bands of infrared radiation, but without changing the lattice constant. The alloy composition is varied by changing the relative thicknesses of HgTe and $Cd_{0.944}Zn_{0.056}Te$. A similar structure can also be fabricated using HgTe and lattice matched $CdTe_{1-y}Se_y$. Thus, a multi-band infrared absorbing material structure can be fabricated which has reduced dislocation defects, and thereby produce detectors with improved performance.

35 Claims, 2 Drawing Sheets

U.S. PATENT DOCUMENTS

| | | | |
|---|---|---|---|
| 4,566,918 | * 1/1986 | Irnive et al. | 438/509 |
| 4,589,192 | 5/1986 | Dinan et al. | 29/572 |
| 4,603,258 | 7/1986 | Sher et al. | 250/370 |
| 4,650,539 | 3/1987 | Irvine et al. | 156/613 |
| 4,689,650 | 8/1987 | Dinan | 357/30 |
| 4,697,202 | 9/1987 | Sher | 357/63 |
| 4,719,124 | 1/1988 | Lu et al. | 117/104 |
| 4,731,640 | 3/1988 | Bluzer | 357/30 |
| 4,735,662 | 4/1988 | Szabo et al. | 136/256 |
| 4,753,684 | 6/1988 | Ondris et al. | 136/258 |
| 4,764,261 | 8/1988 | Ondris et al. | 204/37.1 |
| 4,779,004 | 10/1988 | Tew et al. | 250/578 |
| 4,783,594 | 11/1988 | Schulte et al. | 250/370.08 |
| 4,824,520 | 4/1989 | Morrison | 156/620.1 |
| 4,862,236 | 8/1989 | Shin et al. | 357/30 |
| 4,885,619 | 12/1989 | Kosai | 357/24 |
| 4,916,088 | 4/1990 | Mooney et al. | 438/493 |
| 4,952,811 | 8/1990 | Elliott | 250/370.13 |
| 4,956,304 | 9/1990 | Cockrum et al. | 438/73 |
| 4,970,567 | 11/1990 | Ahlgren et al. | 357/30 |
| 5,037,621 | 8/1991 | Kennedy et al. | 422/248 |
| 5,063,166 | 11/1991 | Mooney et al. | 438/506 |
| 5,068,695 | 11/1991 | Mooney et al. | 357/16 |
| 5,113,076 | 5/1992 | Schulte | 250/370.06 |
| 5,196,692 | 3/1993 | Arinaga et al. | 250/208.1 |
| 5,264,699 | 11/1993 | Barton et al. | 250/338.4 |
| 5,296,384 | 3/1994 | Cockrum et al. | 438/73 |
| 5,302,232 | 4/1994 | Ebe et al. | 156/614 |
| 5,308,980 | 5/1994 | Barton | 250/338.4 |
| 5,394,826 | 3/1995 | Ebe et al. | 117/101 |
| 5,399,206 | 3/1995 | de Lyon | 148/334 |
| 5,401,986 | 3/1995 | Cockrum et al. | 257/188 |
| 5,454,002 | 9/1995 | McCann | 372/36 |
| 5,483,088 | 1/1996 | Chen et al. | 257/189 |
| 5,581,117 | 12/1996 | Kawano | 257/627 |
| 5,959,299 | * 9/1999 | Castro et al. | 250/339.15 |

OTHER PUBLICATIONS

"Improved Arsenic Doping in MOCVD of HgCdTe and in situ Growth of High Performance Long Wavelength Infrared Photodiodes", P. Mitra et al, *Journal of Electronic Materials*, vol. 25, No. 8 (1996) pp. 1328–1335.

"MOCVD of Bandgap–Engineered HgCdTe p–n–N–P Dual– Band Infrared Detector Arrays", P. Mitra et al, *Journal of Electronic Materials*, vol. 26, No. 6 (1997) pp. 482–487.

"Effects Influencing the Structural Integrity of Semiconductors and their Alloys", A. Sher et al, *J. Vac. Sci. Technol. A*, vol. 3, No. 1, pp. 105–111 (1985).

"Densities and Lattice Parameters of CdTe, CdZnTe and CdTeSe", D. J. Williams, *Properties of Narrow Gap Cadmium Based Compounds*, P Capper ed., EMIS Datareviews Series 10, (1994) pp. 339–402.

"$Hg_{0.8}$ $Cd_{0.2}Te$ grown by liquid phase epitaxy using $Cd_{0.94}Zn_{0.06}Te$ buffer layer", N. J. Kwak et al, *Journal of Crystal Growth*, 2300, 138 (1994) pp. 950–955.

* cited by examiner

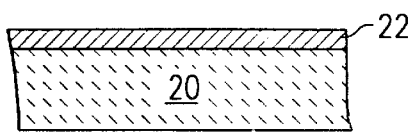
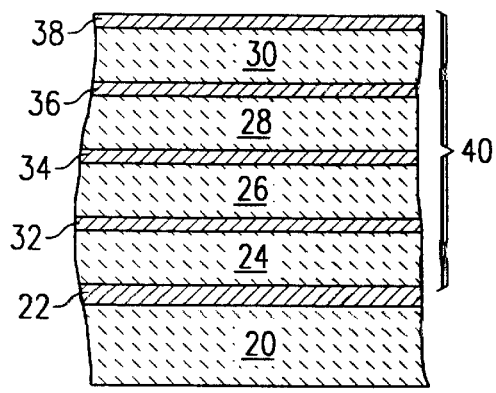
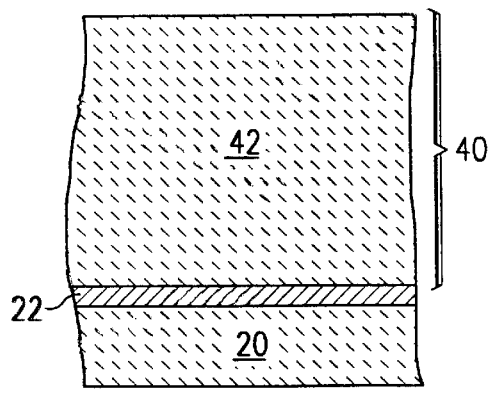
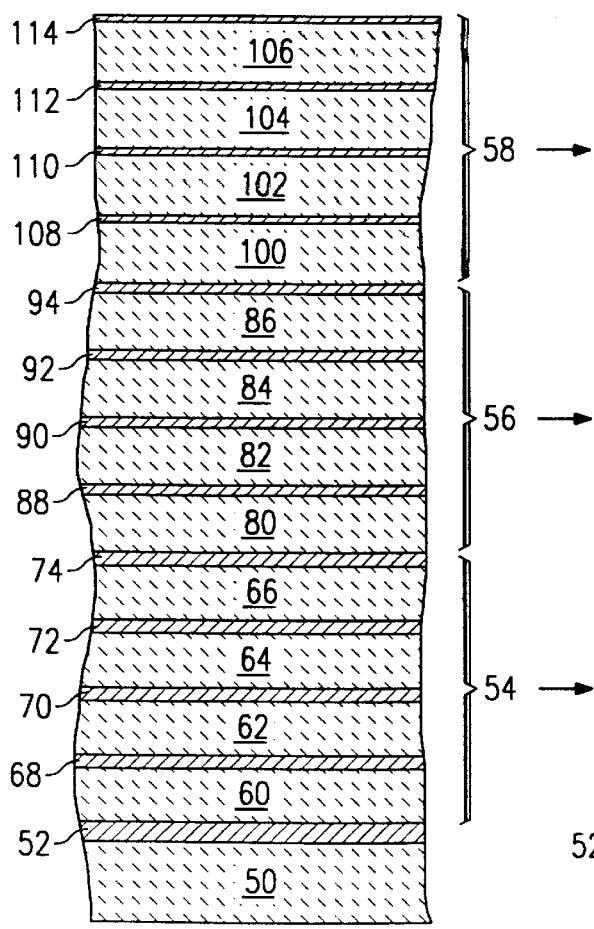
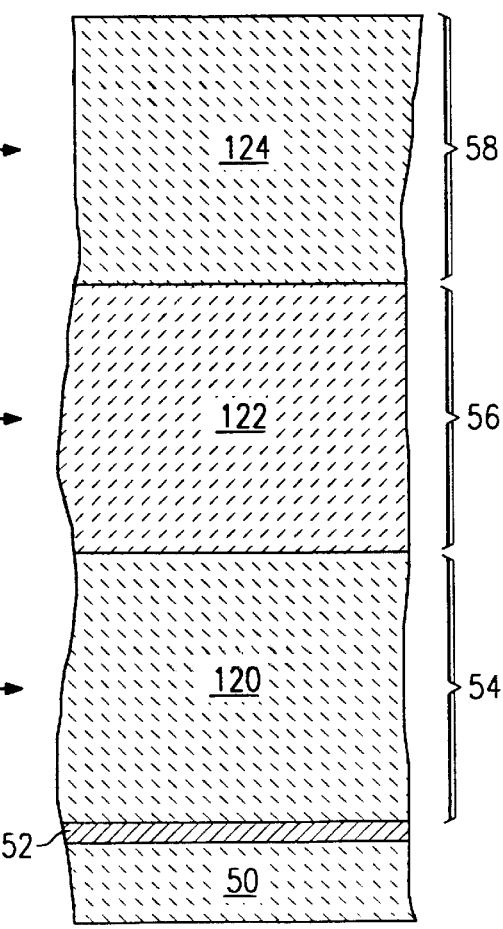

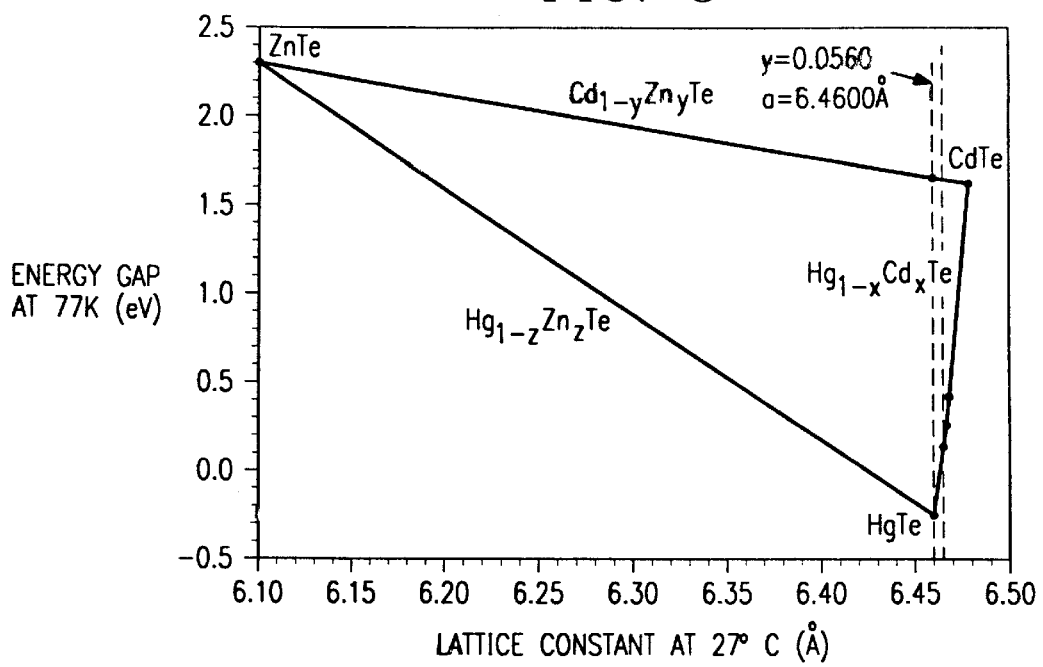
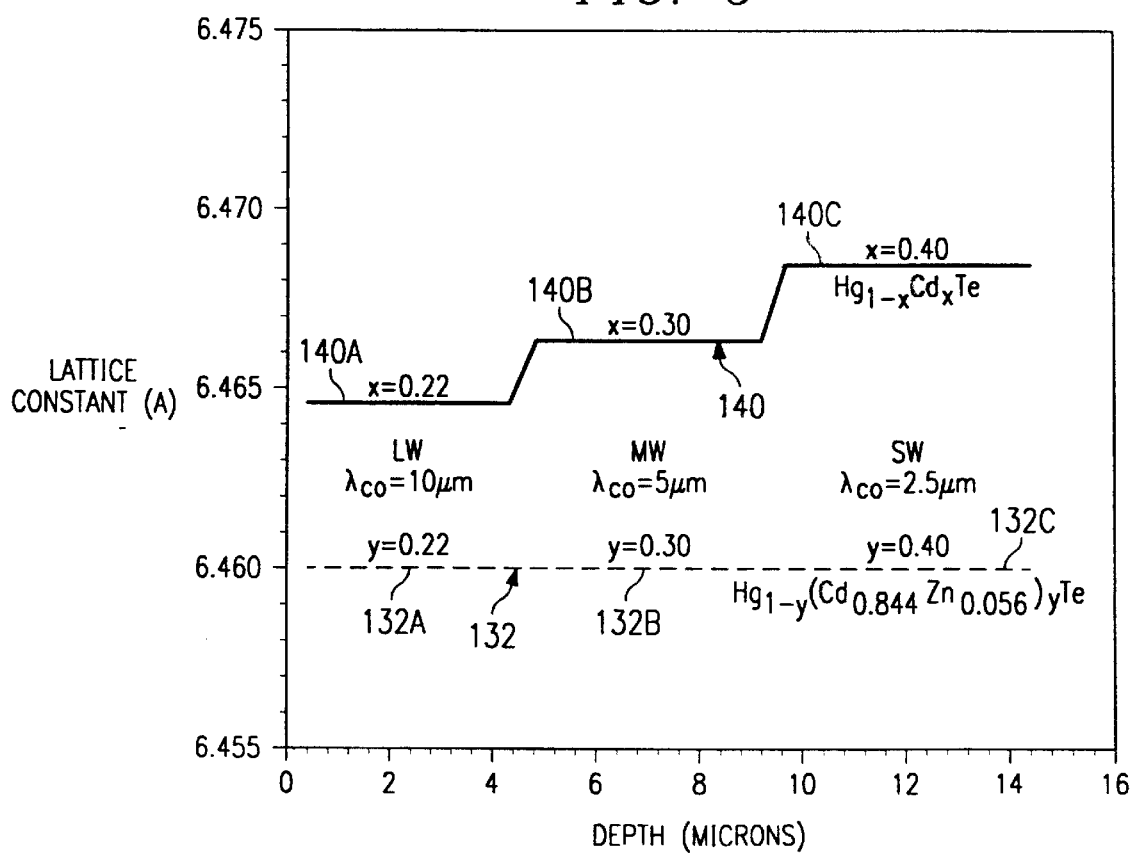

MERCURY-BASED QUATERNARY ALLOYS OF INFRARED SENSITIVE MATERIALS

This is a division of U.S. patent application Ser. No. 08/882,881 filed Jun. 26, 1997.

TECHNICAL FIELD OF THE INVENTION

The present invention pertains in general to infrared radiation absorbing material $Hg_{1-x}Cd_xTe$ and more specifically to such material structures which are fabricated by use of the interdiffused multilayer growth process.

BACKGROUND OF THE INVENTION

One process for the production of the infrared absorbing semiconductor material, $Hg_{1-x}Cd_xTe$, is termed MOCVD-IMP (Metalorganic Chemical Vapor Deposition-Interdiffused Multilayer Process). With this manufacturing process, alternating layers of CdTe and HgTe are grown with a total period thickness in the range of 20–120 nm (nanometers). After these layers have been grown by use of the MOCVD process, the group of layers are annealed which causes them to interdiffuse and form a homogeneous HgCdTe alloy. The mole fraction of the cadmium in the alloy is termed the "x" value, and this determines the wavelength of response for the infrared detector. This process is disclosed in U.S. Pat. No. 4,566,918 entitled "Utilizing Interdiffusion Of Sequentially Deposited Links Of HGTE And CDTE". This patent issued on Jan. 28, 1986.

With the conventional approach for manufacturing an interdiffused multilayer HgCdTe material, there is a maximum 0.33 percent mismatch in the lattice constants between the CdTe and the HgTe. This results in the production of strain at the interface. Although the individual layer thicknesses for the CdTe and the HgTe are thinner than the critical thickness for the onset of dislocation formation, there is still left a residual strain to accommodate for the weak, elastic constants of the HgTe and the underlying interdiffused HgCdTe. This mismatch in the lattice constants contributes to dislocation formation, which can be as high as $1-5 \times 10^6$ $cm^{-2}$.

A significant problem encountered in the design and use of semiconductor infrared detectors is that of dislocation defects in the HgCdTe alloy. These dislocations compromise the transport properties of the semiconductor, which in turn also reduce the performance of the HgCdTe infrared detectors. Furthermore, infrared detector devices requiring heterostructures with two or more dissimilar $Hg_{1-x}Cd_xTe$ alloy compositions have additional misfit dislocations at the interfaces due to the different lattice constants. These dislocations also reduce the performance of HgCdTe detector structures with heterostructures and heterojunctions. Therefore, there is a need for a method of manufacture, and a resulting infrared sensitive material structure, which has a reduced defect density.

SUMMARY OF THE INVENTION

A selected embodiment of the present invention is a method for fabricating HgCdTe based material structure which has a reduced defect density. The method includes the step of forming a cadmium zinc telluride ($Cd_{1-y}Zn_yTe$) buffer layer on a cadmium telluride based substrate. The substrate may include zinc or selenium. Next, on the buffer layer, alternating layers of mercury telluride and cadmium zinc telluride are epitaxially grown. The mercury telluride has a given lattice constant. The buffer layer and the cadmium zinc telluride layers have a mole fraction of zinc which produces within these layers a lattice constant which is substantially similar or identical to the lattice constant of the mercury telluride layers. Finally, the structure is annealed to interdiffuse the mercury telluride and the cadmium zinc telluride layers to produce a homogeneous mercury cadmium zinc telluride alloy on a cadmium zinc telluride substrate with a lattice matched CdZnTe buffer layer.

A still further embodiment of the present invention is an infrared radiation material structure having reduced dislocation defects. This structure includes a cadmium telluride based supporting substrate which may include zinc or selenium with a mole fraction of 4%±1%. It further includes a buffer layer which is epitaxially grown on the substrate wherein the buffer layer comprises cadmium zinc telluride. A homogeneous alloy structure of mercury cadmium zinc telluride is formed by vapor phase epitaxy on the buffer layer of alternating layers of mercury telluride and cadmium zinc telluride. The $Cd_{1-y}Zn_yTe$ layers and the buffer layer have a zinc mole fraction y to produce therein a lattice constant which is substantially similar to the lattice constant of the mercury telluride layers. The multiple pairs of mercury telluride and cadmium zinc telluride layers are annealed to form the homogeneous alloy structure.

The composition of the alloy is controlled by varying the relative thicknesses of mercury telluride (HgTe) and CdZnTe.

In still further embodiments of the present invention, multiple alloy structures can be formed for detecting single or multiple wavelength bands of infrared radiation but all with the same lattice constants. This is achieved by epitaxial growth of alternating thin layers of HgTe and lattice matched CdZnTe. Only the relative thicknesses of the two lattice matched pairs are varied to adjust the alloy compositions. The number of pairs are selected depending on the overall thickness of the homogeneous alloy. Further, CdTeSe can be substituted for the CdZnTe. Instead of cadmium zinc telluride layers, cadmium telluride selenide layers can be used with a composition that is substantially lattice matched to mercury telluride.

BRIEF DESCRIPTION OF THE DRAWINGS

For a more complete understanding of the present invention and the advantages thereof, reference is now made to the following description taken in conjunction with the accompanying drawings in which:

FIG. 1 is a section view illustrating the formation of a lattice matching buffer layer on a substrate for the production of an infrared radiation sensitive material structure in accordance with the present invention, FIG. 2 is a section view of the growth scheme for producing a semiconductor infrared material structure by use of the interdiffused multilayer process with multiple pairs of HgTe and CdZnTe as implemented in conjunction with the present invention, FIG. 3 is a section view illustrating the structure formed in FIG. 2 after it has been annealed to form a homogeneous alloy of mercury cadmium zinc telluride, FIG. 4A is a section view of a material structure formed with three regions, each with different IMP periods (thickness of a HgTe and CdZnTe pair) for different alloy compositions, such as for short wave, medium wave and long wave infrared radiation, FIG. 4B is a section view illustrating the semiconductor structure shown in FIG. 4A after annealing which produces corresponding homogeneous mercury cadmium zinc telluride alloy regions corresponding respectively to the three different compositions, FIG. 5 is a chart illustrating the lattice constants of CdTe-HgTe-ZnTe system as a function of the energy gap for those materials, and FIG. 6 is a chart illustrating the structure of conventional three stacked layers of mercury cadmium telluride with different alloy compositions having corresponding lattice constants for each layer and three layers of mercury cadmium zinc telluride, in accordance with the present invention, which has the same lattice constant for each layer with nominally similar bandgaps as the HgCdTe.

DETAILED DESCRIPTION

The conventional process for manufacturing $Hg_{1-x}Cd_xTe$ alloys by the use of an interdiffusion multilayer process (IMP) is shown in U.S. Pat. No. 4,566,918, which patent is incorporated herein by reference.

The process of the present invention is illustrated beginning with FIG. 1. A substrate 20 comprising cadmium telluride forms a supporting substrate and starting material. This substrate may comprise only cadmium telluride or it may include either zinc or selenium. A preferred substrate of this type is manufactured and sold by Johnson Matthey Electronics, a corporation in Spokane, Wash. The preferred substrate 20 is roughly (3–5% zinc content) lattice matched to mercury cadmium telluride. The substrate 20 has a thickness which is approximately 0.8–1 millimeter.

A buffer layer 22 is formed on the surface of the substrate 20 by epitaxial growth. The layer 22 comprises $Cd_{1-y}Zn_yTe$ which is grown in a conventional manner. The layer 22 has a thickness in the range of 2–10 microns and a Zn mole fraction of 0.056 to achieve a lattice constant substantially similar to HgTe.

After the buffer layer 22 has been grown, alternating layers of HgTe and CdZnTe are grown epitaxially, as shown in FIG. 2. Zinc can be added to the MOCVD-IMP manufacturing operation by use of precursors such as dimethylzinc-triethylamine or diethyl zinc. Standard precursors can be used for cadmium and tellurium, for example as described in J. B. Mullin and S. J. C. Irvine, "Metalorganic vapor phase epitaxy of mercury cadmium telluride", *Progress in Crystal Growth and Characterization* vol. 29, pp 217–252 (1994). This structure includes HgTe layers 24, 26, 28 and 30. Each of these layers has a preferable thickness of 10–80 nanometers, depending on the desired alloy composition.

The buffer layer 22 is needed because commercially available CdZnTe substrates are known to have significant variations in Zn content due to the high segregation coefficient of Zn in bulk CdZnTe. The buffer layer 22 establishes a uniform crystalline lattice matched structure for forming the multiple pairs of interdiffused layers.

Further referring to FIG. 2, there are grown alternating CdZnTe layers 32, 34, 36 and 38. Each of these layers has a preferable thickness of 10–30 nanometers. The preferred composition for each of these layers is $Cd_{0.944}Zn_{0.056}Te$. This mole fraction of Zn produces a lattice constant that is substantially similar to that of mercury telluride. As used herein the term "substantially similar" means a difference of less than 0.1 percent. As noted previously, a maximum lattice mismatch of 0.33 percent between HgTe and CdTe in conventional MOCVD-IMP produces defects which compromise the electrical transport properties of the HgCdTe alloy and increases the reverse bias dark currents in p-n junction photodiodes, especially at lower temperatures. Both the HgTe layers, such as 24, and the cadmium zinc telluride layers ($Cd_{0.0944}Zn_{0.056}Te$), such as 32, have a lattice constant of 0.6460 nm. Tobin et al, "*The Relationship Between lattice Matching and Crosshatch in Liquid Phase Epitaxy HgCdTe on CdZnTe Substrates*". Journal of Electronic Materials, Vol. 24, No. 9, 1995, p 1189–1199.

Further referring to FIG. 2, the combination of layers 24–38 comprises a region 40 $Hg_{1-x}(Cd_{0.944}Zn_{0.056})_xTe$ which is sensitive to infrared radiation. The infrared response wavelength is a function of the x value in a manner similar to $Hg_{1-x}Cd_xTe$.

Referring to FIG. 3, the region 40 has been subject to an anneal treatment process in which the structure is heated for 10–20 minutes at a temperature of approximately 360 degrees centigrade. As a result of this heat treatment, the region 40 becomes a homogeneous quaternary alloy 42 of mercury cadmium zinc telluride.

A still further embodiment of the present invention is illustrated in FIGS. 4A and 4B. The structure shown in FIGS. 4A and 4B has a substrate 50 and an epitaxial buffer layer 52, which correspond respectively to the substrate 20 and the buffer layer 22 shown in FIGS. 1–3. The structure in FIGS. 4A and 4B has three regions which are formed in sequence. These are regions 54, 56 and 58. Region 54 is designed to absorb short wave infrared radiation which is typically in the wavelength range of 1.7–3.0 microns. Region 56 is designed to absorb infrared radiation which is typically in the medium wave band which is 3.0–5.0 microns. Region 58 is designed to absorb long wave infrared radiation which is typically in the range of 8.0–12.0 microns.

For the structure shown in FIG. 4A there are alternating layers of HgTe and CdZnTe formed above the buffer layer 52. The CdZnTe layers have the same composition as noted above for the layers such as 24 and 26 in FIG. 2. This is $Cd_{0.944}Zn_{0.056}Te$.

As shown in FIG. 4A, there are HgTe layers 60, 62, 64 and 66. These are interleaved with CdZnTe layers 68, 70, 72 and 74. In region 56, there are HgTe layers 80, 82, 84 and 86. These are interleaved with CdZnTe layers 88, 90, 92 and 94. Region 58 comprises HgTe layers 100, 102, 104 and 106 interleaved with CdZnTe layers 108, 110, 112 and 114.

In the region 54, as shown in FIG. 4A, each of the HgTe layers has a preferred thickness of 30 nm. Each of the CdZnTe layers has a preferred thickness of 20 nm. In the region 56, the HgTe layers each have a thickness of approximately 46 nm and the CdZnTe layers have a thickness of 20 nm. In the region 58, each of the HgTe layers has a thickness of approximately 70 nm while each of the CdZnTe layers has a thickness of approximately 20 nm. The change from one region to another in the relative amount of HgTe with respect to the CdZnTe changes the band gap and produces the change in the alloy composition of the HgCdZnTe. However, it does not change the lattice constant, so there is less stress at the interfaces and therefore a reduction in the number of dislocation defects, in comparison to the prior art which does not have the alternating CdZnTe layers for lattice matching, such as shown in the 4,566,918 patent.

In FIG. 4A, although only four pairs of HgTe and CdZnTe are shown for each of the three alloy compositions, the number of pairs can be substantially greater to achieve the overall desired thickness. The actual thickness of the individual pairs are for illustration only and may be varied. The total thickness of a $HgTeCd_{0.944}Zn_{0.056}Te$ pair should be less than or equal to 150 nanometers.

The structure shown in FIG. 4B is produced as a result of an anneal operation for the structure shown in 4A. The anneal comprises heating at approximately 360 degrees centigrade for a period of 10–20 minutes. The mercury, cadmium and zinc in each region interdiffuses and leaves no memory of the IMP periods. The region 54, as shown in FIG. 4A, becomes an alloy 120 of mercury cadmium zinc telluride. Similar alloys 122 and 124 are formed respectively from the regions 56 and 58. Each of the alloys 120, 122 and 124 retains its particular infrared absorption, for specific bands, as described for the structure shown in FIG. 4A.

The structures shown in FIGS. 1–4A and 4B can be doped in the same manner as conventional HgCdTe detectors, such as described in P. Mitra, Y. L. Tyan, T. R. Schimert and F. C. Case, "Donor doping in metalorganic chemical vapor deposition of HgCdTe using ethyl iodide", *Appl. Phys. Lett.* 65 195–197 (1994), P. Mitra, T. R. Schimert, F. C. Case, S. L. Barnes, R. Starr, M. H. Weiler, and M. Kestigian, "Metalorganic chemical vapor deposition of HgCdTe p/n junctions using arsenic and iodine doping", *J. Electronic Materials* 24, 1077–1085 (1995), and P. Mitra, Y. L. Tyan, F. C. Case, R. Starr and M. B. Reine, "Improved arsenic doping in MOCVD of HgCdTe and in situ growth of high performance long wavelength infrared photodiodes", *J. Electronic Materials* 25, 1328–1335 (1996), which are incorporated herein. The fabrication, biasing and signal detection are likewise the same as for conventional HgCdTe infrared detectors. Structures with multiple alloy compositions using conventional MOCVD-IMP grown HgCdTe alloys are described in P. Mitra, S. L. Barnes, F. C. Case, M. B. Reine, P. O'Dette, R. Starr, A. Hairston, K. Kuhler, M. H. Weiler and B. L. Musicant, "MOCVD of bandgap-engineered HgCdTe p-n-N-P dual-band infrared detector arrays", *J. Electronic Materials* 26, 482–487 (1997). The dual-band infrared detector devices described in this article can be fabricated with reduced defects using the present invention.

Referring to FIG. 5, there is shown a chart illustrating the lattice constant of the CdTe-HgTe-ZnTe system with respect to the energy gap for those materials. Note that the lattice constant for HgTe is approximately 6,4600 angstroms (0.64600 nm). Note that $Cd_{1-y}Zn_yTe$ having y=0.056 has substantially the same lattice constant as HgTe.

FIG. 6 illustrates a chart for the structure described in reference to FIGS. 4A and 4B and a chart for a prior art for a three layer HgCdTe structure. The line 132 represents the material which corresponds at various segments to the alloys shown in FIG. 4B. A segment of the line 132A corresponds to alloy 124, line segment 132B corresponds to alloy 122, and line segment 132C corresponds to alloy 120. The "y" value adjacent each segment represents the ratio of mercury to the combination of cadmium and zinc as indicated in the formula shown just below the line 132. The variation in the quantity "y" represents a change in the alloy composition and therefore the bandgap of the semiconductor. The nominal cutoff wavelengths for the long wave, medium wave and short wave infrared bands is illustrated in FIG. 6. These are respectively 10 microns, 5 microns and 2.5 microns. A chart line 140 for a conventional structure is shown in FIG. 6 with line 140 having line segments 140A, 140B and 140C. Line segment 140A represents x=0.22 for long wave radiation. Line segment 140B represents x=0.30 for medium wave radiation and line segment 140C represents x=0.40 for short wave infrared radiation. Note that for each of the different infrared wavelengths there is a different lattice constant. These lattice constants are respectively the approximate values 6.4647, 6.4664 and 6.4685 angstroms. The structure represented by line 140 represents the prior art wherein a change in the cutoff wavelength for a material also changes the lattice constant for that material. A structure, such as shown in FIGS. 4A and 4B for the present invention, corresponds to the line 132 and shows that such a structure can be built with a constant lattice constant, but with variation in the "y" value to receive infrared radiation in different bands.

A further advantage of the present invention is that by incorporating zinc into the HgCdTe, the resulting quaternary alloy will have an increased hardness and reduced dislocation density due to the shorter ZnTe bond length and the higher energy required for the formation of dislocations. A. Sher, A-B. Chen, W. E. Spicer and C-K. Shih, "Effects influencing the structural integrity of semiconductors and their alloys", *J. Vacuum Science and Technology* Vol. A3, pp 105–111 (1985).

A lattice matched structure in accordance with the present invention can be made by substituting $CdTe_{1-x}Se_x$ in place of $Cd_{1-y}Zn_yTe$. This substitution uses the composition $CdTe_{1-z}Se_z$ (cadmium telluride selenide) with an approximate value of z=0.0516. An equation supporting this value is shown in D. J. Williams, "Densities and lattice parameters of CdTe, CdZnTe and CdTeSe" in *Properties of Narrow Gap Cadmium based Compounds,* P Capper ed., EMIS Datareviews Series 10, 1994, pp 339–402. This composition of CdTeSe has a lattice constant that is substantially similar to the lattice constant of HgTe.

In summary, the present invention comprises a method of fabrication for an IMP infrared material structure which has a substantially similar lattice constant throughout the structure and therefore has a reduction in the number of dislocation defects.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What is claimed is:

1. A variable bandgap infrared absorbing semiconductor material structure, comprising:
    a substrate,
    a buffer layer epitaxially grown on said substrate, said buffer layer comprising cadmium zinc telluride, and
    a homogeneous alloy structure of mercury cadmium zinc telluride formed by epitaxial growth on said buffer layer of alternating layers of mercury telluride and cadmium zinc telluride, said cadmium zinc telluride layers and said buffer layer having a zinc mole fraction to produce therein a lattice constant substantially similar to the lattice constant of said mercury telluride layers, and wherein said mercury telluride and cadmium zinc telluride layers are annealed to form said homogeneous alloy structure.

2. A variable bandgap infrared absorbing semiconductor material structure as recited in claim 1 wherein said substrate is a cadmium telluride based substrate.

3. A variable bandgap infrared absorbing semiconductor material structure as recited in claim 2 wherein said cadmium telluride based substrate includes selenium.

4. The structure of claim 2 wherein said substrate includes zinc.

5. A variable bandgap infrared absorbing semiconductor material structure responsive to at least two different bands of infrared radiation, comprising:
    a substrate, a buffer layer epitaxially grown on said substrate, said buffer layer comprising cadmium zinc telluride, a first homogeneous alloy structure of mercury cadmium zinc telluride formed on said buffer layer by epitaxial growth of alternating layers of mercury telluride and cadmium zinc telluride, said first homogeneous alloy structure cadmium zinc telluride layers and said buffer layer having a zinc mole fraction to produce therein a lattice constant substantially similar to the lattice constant of said mercury telluride layers, and wherein said first homogeneous alloy structure of mercury telluride and cadmium zinc telluride layers is annealed to form said first homogeneous alloy structure, said first homogeneous alloy structure further having a zinc mole fraction for producing therein a bandgap responsive to infrared radiation within a first band, and a second homogeneous alloy structure of mercury cadmium zinc telluride formed on said first alloy structure by epitaxial growth of alternating layers of mercury telluride and cadmium zinc telluride, said second homogeneous alloy structure cadmium zinc telluride layer having a zinc mole fraction produce therein a lattice constant substantially similar to the lattice constant of said mercury telluride layers, and wherein said second homogeneous alloy structure of mercury telluride and cadmium zinc telluride layers is annealed to form said second homogeneous alloy structure, second homogeneous alloy structure further having a ratio of cadmium to mercury producing a band gap therein responsive to infrared radiation within a second band.

6. A variable bandgap infrared absorbing semiconductor material structure as recited in claim 5 wherein said substrate is a cadmium telluride based substrate.

7. A variable bandgap infrared absorbing semiconductor material structure as recited in claim 6 wherein said cadmium telluride based substrate includes selenium.

8. The structure of claim 6 wherein said substrate includes zinc.

9. A variable bandgap infrared absorbing semiconductor material structure responsive to short wave, medium wave and long wave bands of infrared radiation, comprising:

a substrate, a buffer layer epitaxially grown on said substrate, said buffer layer comprising cadmium zinc telluride, a first homogeneous alloy structure of mercury cadmium zinc telluride formed on said buffer layer by epitaxial growth of alternating layers of mercury telluride and cadmium zinc telluride, said first structure cadmium zinc telluride layers and said buffer layer having a zinc mole fraction to produce therein a lattice constant substantially similar to the lattice constant of said mercury telluride layers, and wherein said first homogeneous alloy structure of mercury telluride and cadmium zinc telluride layers is annealed to form said first homogeneous alloy structure, said first homogeneous alloy structure further having a cadmium mole fraction for producing therein a bandgap responsive to short wave infrared radiation, a second homogeneous alloy structure of mercury cadmium zinc telluride formed on said first homogeneous alloy structure by epitaxial growth of alternating layers of mercury telluride and cadmium zinc telluride, said second homogeneous alloy structure cadmium zinc telluride layer having a zinc mole fraction to produce therein a lattice constant substantially similar to the lattice constant of said mercury telluride layers, and wherein said second homogeneous alloy structure of mercury telluride and cadmium zinc telluride layers is annealed to form said second homogeneous alloy structure, said second homogeneous alloy structure further having a cadmium mole fraction for producing a bandgap therein responsive to medium wave infrared radiation, and a third homogeneous alloy structure of mercury cadmium zinc telluride formed on said second alloy structure by epitaxial growth of alternating layers of mercury telluride and cadmium zinc telluride, said third homogeneous alloy structure cadmium zinc telluride layer having a zinc mole fraction to produce therein a lattice constant substantially similar to the lattice constant of said mercury telluride layers, and wherein said third homogeneous alloy structure of mercury telluride and cadmium zinc telluride layers is annealed to form said third homogeneous alloy structure, said third structure further having a cadmium mole fraction for producing a bandgap therein responsive to long wave infrared radiation.

10. A variable bandgap infrared absorbing semiconductor material structure as recited in claim 9 wherein said substrate is a cadmium telluride based substrate.

11. A variable bandgap infrared absorbing semiconductor material structure as recited in claim 10 wherein said cadmium telluride based substrate includes selenium.

12. The structure of claim 10 wherein said substrate includes zinc.

13. A variable bandgap infrared absorbing semiconductor material structure, comprising:

a substrate, a buffer layer epitaxially grown on said substrate, said buffer layer comprising cadmium telluride selenide, and a homogeneous alloy structure of mercury cadmium telluride selenide formed by epitaxial growth on said buffer layer of alternating layers of mercury telluride and cadmium telluride selenide, said cadmium telluride selenide layers and said buffer layer having a selenium mole fraction to produce therein a lattice constant substantially similar to the lattice constant of said mercury telluride layers, and wherein said mercury telluride and cadmium telluride selenide layers are annealed to form said homogeneous alloy structure.

14. A variable bandgap infrared absorbing semiconductor material structure as recited in claim 13 wherein said substrate is a cadmium telluride based substrate.

15. A variable bandgap infrared absorbing semiconductor material structure as recited in claim 14 wherein said cadmium telluride based substrate includes selenium.

16. The structure of claim 14 wherein said substrate includes zinc.

17. A variable bandgap infrared absorbing semiconductor material structure responsive to at least two different bands of infrared radiation, comprising:

a substrate comprising, a buffer layer epitaxially grown on said substrate, said buffer layer comprising cadmium telluride selenide, a first homogeneous alloy structure of mercury cadmium telluride selenide formed on said buffer layer by epitaxial growth of alternating layers of mercury telluride and cadmium telluride selenide, said first homogeneous alloy structure of cadmium telluride selenide layers and said buffer layer having a selenium mole fraction to produce therein a lattice constant substantially similar to the lattice constant of said mercury telluride layers, and wherein said first homogeneous alloy structure of mercury telluride and cadmium telluride selenide layers is annealed to form said first homogeneous alloy structure, said first structure further having a cadmium mole fraction for producing therein a bandgap responsive to infrared radiation within a first band, and a second homogeneous alloy structure of mercury cadmium telluride selenide formed on said first homogeneous alloy structure by epitaxial growth of alternating layers of mercury telluride and cadmium telluride selenide, said second homogeneous alloy structure cadmium selenium telluride layer having a selenium mole fraction to produce therein a lattice constant substantially similar to the lattice constant of said mercury telluride layers, and wherein said second homogeneous alloy structure of mercury telluride and cadmium telluride selenide layers is annealed to form said second homogeneous alloy structure, said second homogeneous alloy structure further having a cadmium mole fraction producing a bandgap therein responsive to infrared radiation within a second band.

18. A variable bandgap infrared absorbing semiconductor material structure as recited in claim 17 wherein said substrate is a cadmium telluride based substrate.

19. A variable bandgap infrared absorbing semiconductor material structure as recited in claim 18 wherein said cadmium telluride based substrate includes selenium.

20. The structure of claim 18 wherein said substrate includes zinc.

21. A variable bandgap infrared absorbing semiconductor material structure responsive to short wave, medium wave and long wave bands of infrared radiation, comprising:

a substrate, a buffer layer epitaxially grown on said substrate, said buffer layer comprising cadmium telluride selenide, a first homogeneous alloy structure of mercury cadmium telluride selenide formed on said buffer layer by epitaxial growth of alternating layers of mercury telluride and cadmium telluride selenide, said first homogeneous alloy structure cadmium telluride selenide layers and said buffer layer having a selenium mole fraction to produce therein a lattice constant substantially similar to the lattice constant of said mercury telluride layers, and wherein said first homogeneous alloy structure of mercury telluride and cadmium telluride selenide layers is annealed to form said first homogeneous alloy structure, said first homogeneous alloy structure further having a cadmium mole fraction for producing therein a bandgap responsive to short wave infrared radiation, a second homogeneous alloy structure of mercury cadmium telluride selenide formed on said first homogeneous alloy structure by epitaxial growth of alternating layers of mercury telluride and cadmium telluride selenide, said second homogeneous alloy structure cadmium telluride selenide layer having a selenium mole fraction to produce therein a lattice constant substantially similar to the lattice constant of said mercury telluride layers, and wherein said second homogeneous structure alloy of mercury telluride and cadmium telluride selenide layers is annealed to form said second structure homogeneous alloy, said second homogeneous alloy structure further having a cadmium mole fraction for producing a bandgap therein responsive to medium wave infrared radiation, and a third homogeneous alloy structure of mercury cadmium telluride selenide formed on said second homogeneous alloy structure by epitaxial growth of alternating layers of mercury telluride and cadmium telluride selenide, said third homogeneous alloy structure cadmium telluride selenide layer having a selenium mole fraction to produce therein a lattice constant substantially similar to the lattice constant of said mercury telluride layers, and wherein said third homogeneous alloy structure of mercury telluride and cadmium telluride selenide layers is annealed to form said third structure homogeneous alloy, said third homogeneous alloy structure further having a cadmium mole fraction for producing a bandgap therein responsive to long wave infrared radiation.

22. A variable bandgap infrared absorbing semiconductor material structure as recited in claim 21 wherein said substrate is a cadmium telluride based substrate.

23. A variable bandgap infrared absorbing semiconductor material structure as recited in claim 22 wherein said cadmium telluride based substrate includes selenium.

24. The structure of claim 22 wherein said substrate includes zinc.

25. A variable bandgap infrared absorbing semiconductor structure comprising:

a semiconductor substrate; and a homogeneous alloy having a lattice constant of about 6.46 angstroms of the formula $Hg_{1-x}(Cd_{1-y}Zn_y)_xTe$ wherein y represents the mole fraction of zinc and x represents the mole fraction of the $(Cd_{1-y}Zn_y)$, wherein the lattice constant of cadmium zinc telluride is substantially similar to the lattice constant of mercury telluride.

26. The semiconductor structure of claim 20 wherein the lattice constant is 6.4647.

27. The semiconductor structure of claim 25 wherein the lattice constant is 6.4664.

28. The semiconductor structure of claim 25 wherein the lattice constant is 6.4685.

29. The variable bandgap infrared absorbing semiconductor structure of claim 25 further comprising a one or more additional layers of a homogeneous alloy of the formula $Hg_{1-x}(Cd_{1-y}Zn_y)_xTe$ wherein y represents the mole fraction of zinc, and x represents the mole fraction of the cadmium and zinc; wherein the value of y for each layer of alloy is different from the other layers.

30. The semiconductor structure of claim 29 wherein there are three layers of material and the value of y in the different layers is 0.22, 0.3 and 0.4.

31. A variable bandgap infrared absorbing semiconductor structure comprising:

a substrate; and a homogeneous alloy of the formula $Hg_{1-x}Cd(Te_{1-z}Se_z)_x$ wherein z represents the mole fraction of selenium and x represents the mole fraction of the telluride and selenium, and wherein the lattice constant of cadmium selenium telluride is substantially similar to the lattice constant of the mercury telluride.

32. The variable bandgap infrared absorbing structure of claim 31 wherein z is 0.0516.

33. The structure of claim 31 further comprising one or more additional layers of a homogeneous alloy of the formula $Hg_{1-x}Cd(Te_{1-z}Se_z)_x$ wherein z represents the mole fraction of selenium and x represents the mole fraction of the telluride and selenium and wherein the value of z in each layer is different.

34. A detector structure for a variable bandgap infrared absorbing semiconductor comprising two or more layers of mercury cadmium zinc telluride on a substrate wherein each of the layers has a lattice constant that is substantially similar to that of mercury telluride.

35. A detector structure for a variable bandgap infrared absorbing semiconductor comprising two or more layers of mercury cadmium telluride selenide on a substrate wherein each of the layers has a lattice constant that is substantially similar to that of mercury telluride.

* * * * *

UNITED STATES PATENT AND TRADEMARK OFFICE
CERTIFICATE OF CORRECTION

PATENT NO. : 6,208,005 B1
DATED : March 27, 2001
INVENTOR(S) : Pradip Mitra

It is certified that error appears in the above-identified patent and that said Letters Patent is hereby corrected as shown below:

Column 8,
Line 65, delete "of".

Column 9,
Line 60, delete "structure alloy", and insert -- alloy structure --.
Line 62, delete structure homogeneous alloy," and insert
-- homogenous alloy structure,--.

Column 10,
Lines 9 and 10, delete " third structure homogeneous alloy,", and insert -- third homogeneous alloy structure, --.
Line 33, delete "20", and insert -- 25 --.

Signed and Sealed this

First Day of January, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,208,005 B1
DATED         : March 27, 2001
INVENTOR(S)   : Pradip Mitra It is certified that error appears in the above-identified patent and that said Letters Patent is hereby corrected as shown below:

Column 8,
Line 65, delete "of".

Column 9,
Line 60, delete "structure alloy", and insert -- alloy structure --.
Line 62, delete structure homogeneous alloy," and insert
-- Homogeneous alloy structure,--.

Column 10,
Lines 9 and 10, delete " third structure homogeneous alloy,", and insert -- third homogeneous alloy structure, --.
Line 33, delete "20", and insert -- 25 --.

This certificate supersedes Certificate of Correction issued January 1, 2002

Signed and Sealed this

Twentieth Day of August, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.    : 6,208,005 B1
DATED         : March 27, 2001
INVENTOR(S)   : Pradip Mitra It is certified that error appears in the above-identified patent and that said Letters Patent is hereby corrected as shown below:

<u>Column 8,</u>
Line 65, delete "of".

<u>Column 9,</u>
Line 60, delete "structure alloy", and insert -- alloy structure --.
Line 62, delete "structure homogeneous alloy," and insert -- homogeneous alloy structure, --.

<u>Column 10,</u>
Lines 9 and 10, delete "third structure homogeneous alloy,", and insert -- third homogeneous alloy structure, --.
Line 33, delete "20", and insert -- 25 --.

This certificate supersedes Certificate of Correction issued August 20, 2002.

Signed and Sealed this

Eleventh Day of March, 2003

JAMES E. ROGAN
*Director of the United States Patent and Trademark Office*